US006134175A

United States Patent [19]
Forbes et al.

[11] Patent Number: 6,134,175
[45] Date of Patent: Oct. 17, 2000

[54] MEMORY ADDRESS DECODE ARRAY WITH VERTICAL TRANSISTORS

[75] Inventors: Leonard Forbes, Corvallis, Oreg.; Wendell P. Noble, Milton, Vt.

[73] Assignee: Micron Technology, Inc., Boise, Id.

[21] Appl. No.: 09/128,848

[22] Filed: Aug. 4, 1998

[51] Int. Cl.[7] .................................................. G11C 8/00
[52] U.S. Cl. ...................................... 365/230.06; 257/302
[58] Field of Search ........................ 365/230.06, 230.01; 257/302; 438/242

[56] References Cited

U.S. PATENT DOCUMENTS

| 4,020,364 | 4/1977 | Kuijk | 327/411 |
|---|---|---|---|
| 4,051,354 | 9/1977 | Choate | 235/312 |
| 4,313,106 | 1/1982 | Hsu | 340/825.91 |
| 4,604,162 | 8/1986 | Sobczak | 156/657 |

(List continued on next page.)

OTHER PUBLICATIONS

Adler, E., et al., "The Evolution of IBM CMOS DRAM Technology", *y*, 167–188, (Jan./Mar., 1995).

Asai, S., et al., "Technology Challenges for Integration Near and Below 0.1 micrometer", Proceedings of the IEEE, 85, Special Issue on Nanometer–Scale Science & Technology, 505–520, (Apr. 1997).

Banerjee, S.K., et al., "Characterization of Trench Transistors for 3–D Memories", 1986 Symposium on VLSI Technology, Digest of Technical Papers, San Diego, CA, 79–80, (May 28–30, 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27, 618–625, (Apr. 1992).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 4–7, 1994).

Burnett, D., et al., "Statistical Threshold–Voltage Variation and its Impact on Supply–Voltage Scaling", Proceedings SPIE: Microelectronic Device and Multilevel Interconnection Technology, 2636, 83–90, (1995).

Chen, M.J., et al., "Back–Gate Forward Bias Method for Low–Voltage CMOS Digital Cicuits", *IEEE Transactions on Electron Devices*, 43, 904–909, (Jun. 1986).

Chen, M.J., et al., "Optimizing the Match in Weakly Inverted MOSFET's by Gated Lateral Bipolar Action", *IEEE Transactions on Electron Devices*, 43, 766–773, (May 1996).

Chung, I.Y., et al., "A New SOI Inverter for Low Power Applications", Proceedings of the 1996 IEEE International SOI Conference, Sanibel Island, FL, 20–21, (Sep. 30–Oct. 3, 1996).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

(List continued on next page.)

*Primary Examiner*—Huan Hoang
*Attorney, Agent, or Firm*—Schwegman, Lundberg, Woessner & Kluth, P.A.

[57] ABSTRACT

A decoder for a memory device is provided. The decoder array includes a number of address lines and a number of output lines. The address lines and the output lines form an array. A number of vertical transistors are selectively disposed at intersections of output lines and address lines. Each transistor is formed in at least one pillar of semiconductor material that extends outwardly from a working surface of a substrate. The vertical transistors each include source, drain, and body regions. A gate is also formed along at least one side of the at least one pillar and is coupled to one of the number of address lines. The transistors in the array implement a logic function that selects an output line responsive to an address provided to the address lines.

33 Claims, 9 Drawing Sheets

U.S. PATENT DOCUMENTS

| | | | |
|---|---|---|---|
| 4,617,649 | 10/1986 | Kyomasu et al. | 365/189 |
| 4,663,831 | 5/1987 | Birrittella et al. | 129/576 E |
| 4,673,962 | 6/1987 | Chatterjee et al. | 357/23.6 |
| 4,716,314 | 12/1987 | Mulder et al. | 307/477 |
| 4,761,768 | 8/1988 | Turner et al. | 365/201 |
| 4,766,569 | 8/1988 | Turner et al. | 365/185 |
| 4,845,537 | 7/1989 | Nishimura et al. | 357/23.4 |
| 4,888,735 | 12/1989 | Lee et al. | 365/185 |
| 4,920,065 | 4/1990 | Chin t al. | 437/52 |
| 4,920,515 | 4/1990 | Obata | 365/189.08 |
| 4,958,318 | 9/1990 | Harari | 365/149 |
| 4,965,651 | 10/1990 | Wagner | 357/42 |
| 4,987,089 | 1/1991 | Roberts | 437/34 |
| 5,001,526 | 3/1991 | Gotou | 357/23.6 |
| 5,006,909 | 4/1991 | Kosa | 357/23.6 |
| 5,010,386 | 4/1991 | Groover, III | 357/42 |
| 5,017,504 | 5/1991 | Nishimura et al. | 437/40 |
| 5,021,355 | 6/1991 | Dhong et al. | 437/35 |
| 5,028,977 | 7/1991 | Kenneth et al. | 357/43 |
| 5,057,896 | 10/1991 | Gotou | 357/49 |
| 5,072,269 | 12/1991 | Hieda | 357/23.6 |
| 5,083,047 | 1/1992 | Horie et al. | 307/465 |
| 5,087,581 | 2/1992 | Rodder | 437/41 |
| 5,102,817 | 4/1992 | Chatterjee et al. | 437/47 |
| 5,110,752 | 5/1992 | Lu | 437/47 |
| 5,156,987 | 10/1992 | Sandhu et al. | 437/40 |
| 5,177,028 | 1/1993 | Manning | 437/41 |
| 5,177,576 | 1/1993 | Kimura et al. | 257/71 |
| 5,202,278 | 4/1993 | Mathews et al. | 437/47 |
| 5,208,657 | 5/1993 | Chatterjee et al. | 257/302 |
| 5,216,266 | 6/1993 | Ozaki | 257/302 |
| 5,221,867 | 6/1993 | Mitra et al. | 307/465 |
| 5,223,081 | 6/1993 | Doan | 156/628 |
| 5,266,514 | 11/1993 | Tuan et al. | 437/52 |
| 5,316,962 | 5/1994 | Matsuo et al. | 437/52 |
| 5,320,880 | 6/1994 | Sandhu et al. | 427/578 |
| 5,327,380 | 7/1994 | Kersh, III et al. | 365/195 |
| 5,376,575 | 12/1994 | Kim et al. | 437/52 |
| 5,391,911 | 2/1995 | Beyer et al. | 257/522 |
| 5,392,245 | 2/1995 | Manning | 365/200 |
| 5,393,704 | 2/1995 | Huang et al. | 437/203 |
| 5,396,093 | 3/1995 | Lu | 257/306 |
| 5,410,169 | 4/1995 | Yamamoto et al. | 257/301 |
| 5,414,287 | 5/1995 | Hong | 257/316 |
| 5,416,350 | 5/1995 | Watanabe | 257/330 |
| 5,422,499 | 6/1995 | Manning | 257/67 |
| 5,427,972 | 6/1995 | Shimizu et al. | 437/43 |
| 5,432,739 | 7/1995 | Pein | 365/185 |
| 5,438,009 | 8/1995 | Yang et al. | 437/52 |
| 5,440,158 | 8/1995 | Sung-Mu | 257/314 |
| 5,445,986 | 8/1995 | Hirota | 437/60 |
| 5,460,316 | 10/1995 | Hefele | 228/39 |
| 5,460,988 | 10/1995 | Hong | 437/43 |
| 5,466,625 | 11/1995 | Hsieh et al. | 437/52 |
| 5,483,094 | 1/1996 | Sharma et al. | 257/316 |
| 5,483,487 | 1/1996 | Sung-Mu | 365/185.33 |
| 5,492,853 | 2/1996 | Jeng et al. | 437/60 |
| 5,495,441 | 2/1996 | Hong | 365/185.01 |
| 5,497,017 | 3/1996 | Gonzales | 257/306 |
| 5,504,357 | 4/1996 | Kim et al. | 257/306 |
| 5,508,219 | 4/1996 | Bronner et al. | 437/52 |
| 5,508,542 | 4/1996 | Geiss et al. | 257/301 |
| 5,519,236 | 5/1996 | Ozaki | 257/302 |
| 5,528,062 | 6/1996 | Hsieh et al. | 257/298 |
| 5,563,083 | 10/1996 | Pein | 437/43 |
| 5,574,299 | 11/1996 | Kim | 257/296 |
| 5,593,912 | 1/1997 | Rajeevakumar | 437/52 |
| 5,616,934 | 4/1997 | Dennison et al. | 257/67 |
| 5,637,898 | 6/1997 | Baliga | 257/330 |
| 5,640,342 | 6/1997 | Gonzalez | 365/156 |
| 5,644,540 | 7/1997 | Manning | 365/200 |
| 5,646,900 | 7/1997 | Tsukude et al. | 365/205 |
| 5,674,769 | 10/1997 | Alsmeier et al. | 437/52 |
| 5,691,230 | 11/1997 | Forbes | 437/62 |
| 5,705,415 | 1/1998 | Orlowski et al. | 437/43 |
| 5,818,084 | 10/1998 | Williams et al. | 257/329 |
| 5,821,578 | 10/1998 | Shiomoji | 257/295 |
| 5,827,765 | 10/1998 | Stengl et al. | 438/243 |
| 5,907,170 | 5/1999 | Forbes et al. | 257/296 |
| 5,909,618 | 6/1999 | Forbes et al. | 438/242 |
| 5,914,511 | 6/1999 | Noble et al. | 257/302 |
| 5,920,088 | 7/1999 | Augusto | 257/192 |
| 5,973,352 | 10/1999 | Noble | 257/315 |

OTHER PUBLICATIONS

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).

Fong, Y., et al., "Oxides Grown on Textured Single–Crystal Silicon—Dependence on Process and Application in EEPROMs", *IEEE Transactions on Electron Devices*, 37, 583–590, (Mar. 1990).

Forbes, L., et al., "Resonant Forward–Biased Guard–Ring Diodes for Suppression of Substrate Noise in Mixed–Mode CMOS Circuits", *Electronics Letters*, 31, 720–721, (Apr. 1995).

Foster, R., et al., "High Rate Low–Temperature Selective Tungsten", *In: Tungsten and Other Refractory Metals for VLSI Applications III*, V.A. Wells, ed., Materials Res. Soc., Pittsburgh, PA, 69–72, (1988).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gong, S., et al., "Techniques for Reducing Switching Noise in High Speed Digital Systems", Proceedings of the 8th Annual IEEE International ASIC Conference and Exhibit, 21–24, (1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Heavens, O., *Optical Properties of Thin Solid Films*, Dover Pubs. Inc., New York, 167, (1965).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", *In: Analysis and Design of Digital Integrated Circuits*, 2nd Edition, McGraw–Hill Book Co., New York, 354–357, (1988).

Holman, W.T., et al., "A Compact Low Noise Operational Amplifier for a 1.2 Micrometer Digital CMOS Technology", *IEEE Journal of Solid–State Circuits*, 30, 710–714, (Jun. 1995).

Hu, G., et al., "Will Flash Memory Replace Hard Disk Drive?", 1994 IEEE International Electron Device Meeting, Panel Discussion, Session 24, Outline, 1 p., (Dec. 13, 1994).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", *In: Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Kohyama, Y., et al., "Buried Bit–Line Cell for 64MB DRAMs", 1990 Symposium on VLSI Technology, Digest of Technical Papers, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31, 586–591, (Apr. 1996).

Lantz, II, L., "Soft Errors Induced By Alpha Particles", *IEEE Transactions on Reliability*, 45, 174–179, (Jun. 1996).

Lehmann, V., "The Physics of Macropore Formation in Low Doped n–Type Silicon", *J. Electrochem. Soc.*, 140, 2836–2843, (Oct. 1993).

Lu, N., et al., "The SPT Cell—A New Substrate–Plate Trench Cell for DRAMs", 1985 IEEE International Electron Devices Meeting, Technical Digest, Washington, D.C., 771–772, (Dec. 1–4, 1985).

MacSweeney, D., et al., "Modelling of Lateral Bipolar Devices in a CMOS Process", IEEE Bipolar Circuits and Technology Meeting, Minneapolis, MN, 27–30, (Sep. 1996).

Maeda, S., et al., "A Vertical Phi–Shape Transistor (VPhiT) Cell for 1 Gbit DRAM and Beyond", 1994 Symposium of VLSI Technology, Digest of Technical Papers, Honolulu, HI, 133–134, (Jun. 7–9, 1994).

Maeda, S., et al., "Impact of a Vertical Phi–Shape Transistor (VPhiT) Cell for 1 Gbit DRAM and Beyond", *IEEE Transactions on Electron Devices*, 42, 2117–2123, (Dec. 1995).

Malaviya, S., *IBM TBD,* 15, p. 42, (Jul. 1972).

Masu, K., et al., "Multilevel Metallization Based on Al CVD", 1996 IEEE Symposium on VLSI Technology, Digest of Technical Papers, Honolulu, HI, 44–45, (Jun. 11–13, 1996).

McCredie, B.D., et al., "Modeling, Measurement, and Simulation of Simultaneous Switching Noise", *IEEE Transactions on Components, Packaging, and Manufacturing Technology—Part B*, 19, 461–472, (Aug. 1996).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, 59–66, (1987).

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA, 17–25, (1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New alpha–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (Simple) Cell with Checkered Layout for 256Mbit DRAMs and Beyond", 1991 IEEE International Electron Devices Meeting, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D Pencil Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", IEEE International Electron Devices Meeting, Technical Digest, 11–14, (1993).

Ramo, S., et al., "Fields and Waves in Communication Electronics", John Wiley & Sons, Inc., New York, 3rd ed, 428–433, (1993).

Rao, K.V., et al., "Trench Capacitor Design Issues in VLSI DRAM Cells", 1986 IEEE International Electron Devices Meeting, Technical Digest, Los Angeles, CA, 140–143, (Dec. 7–10, 1986).

Richardson, W.F., et al., "A Trench Transistor Cross–Point DRAM Cell", IEEE International Electron Devices Meeting, Washington, D.C., 714–717, (Dec. 1–4, 1985).

Sagara, K., et al., "A 0.72 micro–meter2 Recessed STC (RSTC) Technology for 256Mbit DRAMs using Quarter--Micron Phase–Shift Lithography", 1992 Symposium on VLSI Technology, Digest of Technical Papers, Seattle, WA, 10–11, (Jun. 2–4, 1992).

Saito, M., et al., "Technique for Controlling Effective Vth in Multi–Gbit DRAM Sense Amplifier", 1996 Symposium on VLSI Circuits, Digest of Technical Papers, Honolulu, HI, 106–107, (Jun. 13–15, 1996).

Seevinck, E., et al., "Current–Mode Techniques for High–Speed VLSI Circuits with Application to Current Sense Amplifier for CMOS SRAMS's", *IEEE Journal of Solid--State Circuits*, 26, 525–536, (Apr. 1991).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, 1765–1773, (Sep. 1994).

Shah, A.H., et al., "A 4–Mbit DRAM with Trench–Transistor Cell", *IEEE Journal of Solid–State Cirucits*, SC–21, 618–625, (Oct. 1986).

Shah, A.H., et al., "A 4mb DRAM with Cross–Point Trench Transistor Cell", 1986 IEEE International Solid–State Circuits Conference, Digest of Technical Papers, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", 1997 IEEE International Solid–State Circuits Conference, Digest of Technical Papers, 68–69, (Feb. 6, 1997).

Stanisic, B.R., et al., "Addressing Noise Decoupling in Mixed–Signal IC's: Power Distribution Design and Cell Customization", *IEEE Journal of Solid–State Circuits*, 30, 321–326, (Mar. 1995).

Stellwag, T.B., et al., "A Vertically–Integrated GaAs Bipolar DRAM Cell", *IEEE Transactions on Electron Devices*, 38, 2704–2705, (Dec. 1991).

Su, D.K., et al., "Experimental Results and Modeling Techniques for Substrate Noise in Mixed–Signal Integrated Circuits", *IEEE Journal of Solid–State Circuits*, 28, 420–430, (Apr. 1993).

Suma, K., et al., "An SOI–DRAM with Wide Operating Voltage Range by CMOS/SIMOX Technology", *IEEE Journal of Solid–State Circuits*, 29, 1323–1329, (Nov. 1994).

Sun, J., "CMOS Technology for 1.8V and Beyond", Int'l Symp. on VLSI Technology, Systems and Applications: Digest of Technical Papers, 293–297, (1997).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using an Asymmetrical Stacked Trench Capacitor (AST) Cell", 1990 IEEE International Electron Devices Meeting, San Francisco, CA, 647–650, (Dec. 9–12, 1990).

Takai, M., et al., "Direct Measurement and Improvement of Local Soft Error Susceptibility in Dynamic Random Access Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takao, Y., et al., "A 4–um(2) Full–CMOS SRAM Cell Technology for 0.2–um High Performance Logic LSIs", 1997 Symp. on VLSI Technology: Digest of Technical Papers, Kyoto, Japan, 11–12, (1997).

Takato, H., et al., "High Performance CMOS Surrounding Gate Transistor (SGT) for Ultra High Density LSIs", IEEE International Electron Devices Meeting, Technical Digest, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Ferroelectric Memories", 1995 Symposium on VLSI Technology, Digest of Technical Papers, Kyoto, Japan, 123–124, (Jun. 6–8, 1995).

Temmler, D., "Multilayer Vertical Stacked Capacitors (MVSTC) for 64Mbit and 256Mbit DRAMs", 1991 Symposium on VLSI Technology, Digest of Technical Papers, Oiso, 13–14, (May 28–30, 1991).

Terauchi, M., et al., "A Surrounding Gate Transistor (SGT) Gain Cell for Ultra High Density DRAMs", 1993 Symposium on VLSI Technology, Digest of Technical Papers, Kyoto, Japan, 21–22, (1993).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices 38*, 2487–2496, (Nov. 1991).

Vittal, A., et al., "Clock Skew Optimization for Ground Bounce Control", 1996 IEEE/ACM International Conference on Computer–Aided Design, Digest of Technical Papers, San Jose, CA, 395–399, (Nov. 10–14, 1996).

Wang, N., *Digital MOS Integrated Circuits*, Prentice Hall, Inc., Englewood Cliffs, NJ, pp. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", IEEE International Electron Devices Meeting, Technical Digest, San Francisco, CA, 259–262, (Dec. 13–16, 1992).

Watanabe, H., et al., "A Novel Stacked Capacitor with Porous–Si Electrodes for High Density DRAMs", 1993 Symposium on VLSI Technology, Digest of Technical Papers, Kyoto, Japan, 17–18, (1993).

Watanabe, H., et al., "An Advanced Fabrication Technology of Hemispherical Grained (HSG) Poly–Si for High Capacitance Storage Electrodes", Extended Abstracts of the 1991 International Conference on Solid State Devices and Materials, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", Extended Abstracts of the 1992 International Conference on Solid State Devices and Materials, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits,* 30, 960–971, (Sep. 1995).

Yamada, T., et al., "A New Cell Structure with a Spread Source/Drain (SSD) MOSFET and a Cylindrical Capacitor for 64–Mb DRAM's", *IEEE Transactions on Electron Devices,* 38, 2481–2486, (Nov. 1991).

Yamada, T., et al., "Spread Source/Drain (SSD) MOSFET Using Selective Silicon Growth for 64Mbit DRAMs", 1989 IEEE International Electron Devices Meeting, Technical Digest, Washington, D.C., 35–38, (Dec. 3–6, 1989).

Yoshikawa, K., "Impact of Cell Threshold Voltage Distribution in the Array of Flash Memories on Scaled and Multilevel Flash Cell Design", 1996 Symposium on VLSI Technology, Digest of Technical Papers, Honolulu, HI, 240–241, (Jun. 11–13, 1996).

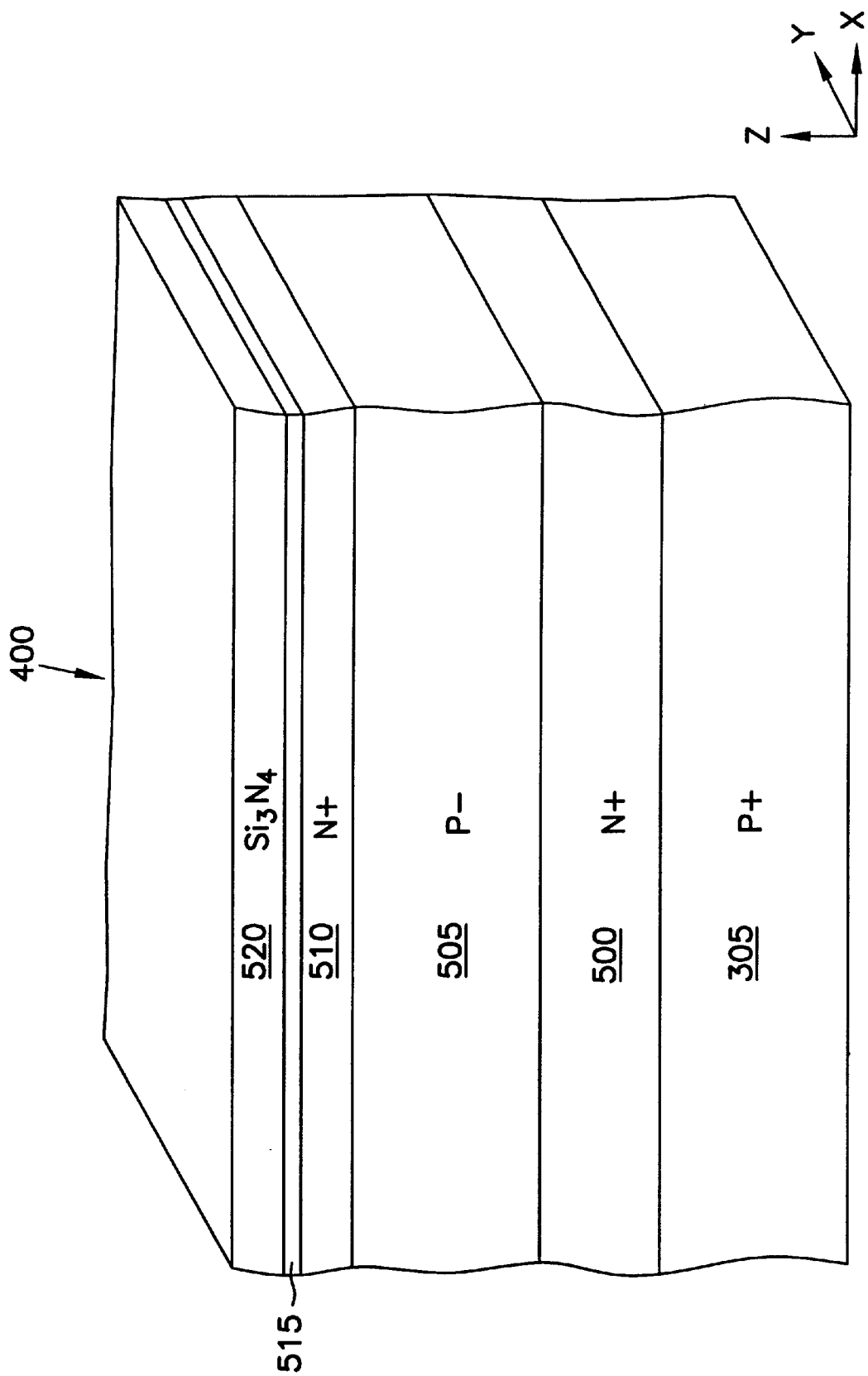

MEMORY ADDRESS DECODE ARRAY WITH VERTICAL TRANSISTORS

TECHNICAL FIELD OF THE INVENTION

This invention relates generally to integrated circuits and in particular to a memory address decode array with vertical transistors.

BACKGROUND OF THE INVENTION

Modern electronic systems typically include a data storage device such as a dynamic random access memory (DRAM), static random access memory (SRAM), video random access memory (VRAM), erasable programmable read only memory (EPROM), flash memory, or other conventional memory device. As these systems become more sophisticated, they require more and more memory in order to keep pace with the increasing complexity of software based applications that run on the systems. Thus, as the technology relating to memory devices has evolved, designers have tried to increase the density of the components of the memory device. For example, the electronics industry strives to decrease the size of memory cells that store the data in the memory device. This allows a larger number of memory cells to be fabricated without substantially increasing the size of the semiconductor wafer used to fabricate the memory device.

Memory devices store data in vast arrays of memory cells. Essentially, the cells are located at intersections of wordlines and bitlines (rows and columns of an array). Each cell conventionally stores a single bit of data as a logical "1" or a logical "0" and can be individually accessed or addressed. Conventionally, each cell is addressed using two multi-bit numbers. The first multi-bit number, or row address, identifies the row of the memory array in which the memory cell is located. The second multi-bit number, or column address, identifies the column of the memory array in which the desired memory cell is located. Each row address/column address combination corresponds to a single memory cell.

To access an individual memory cell, the row and column addresses are applied to inputs of row and column decoders, respectively. Conventionally, row and column decoders are fabricated using programmable logic arrays. These arrays are configured so as to select desired word and bit lines based on address signals applied to the inputs of the array. As with the array of memory cells, the decoder arrays use a portion of the surface area of the semiconductor wafer. Thus, designers also strive to reduce the surface area required for the decoder arrays.

Memory devices are fabricated using photolithographic techniques that allow semiconductor and other materials to be manipulated to form integrated circuits as is known in the art. These photolithographic techniques essentially use light that is focussed through lenses and masks to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum "feature size" (F) of the photolithographic process. The minimum feature size imposes one constraint on the size of the components of a memory device, including the decoder array. In order to keep up with the demands for higher capacity memory devices, designers search for other ways to reduce the size of the components of the memory device, including the decoder array.

For the reasons stated above, and for other reasons stated below which will become apparent to those skilled in the art upon reading and understanding the present specification, there is a need in the art for a decoder array that uses less surface area of a semiconductor wafer as compared to conventional decoder arrays.

SUMMARY OF THE INVENTION

The above mentioned problems with decoder arrays and other problems are addressed by the present invention and will be understood by reading and studying the following specification. A circuit and method for a decoder array using vertical transistors is provided.

In particular, one embodiment of the present invention provides a decoder for a memory device. The decoder array includes a number of address lines and a number of output lines. The address lines and the output lines form an array. A number of vertical transistors are selectively disposed at intersections of output lines and address lines. Each transistor is formed in at least one pillar of semiconductor material that extends outwardly from a working surface of a substrate. The vertical transistors each include source, drain, and body regions. A gate is also formed along at least one side of the at least one pillar and is coupled to one of the number of address lines. The transistors in the array implement a logic function that selects an output line responsive to an address provided to the address lines.

In another embodiment, a memory device is provided. The memory device includes an array of word lines and complementary bit line pairs. A number of memory cells are each addressably coupled at intersections of a word line with a bit line of a complementary bit line pair. A row decoder is coupled to the word lines so as to implement a logic function that selects one of the word lines responsive to an address provided to the row decoder. A number of sense amplifiers are each coupled to a complementary pair of bit lines. A column decoder is coupled to the sense amplifiers so as to implement a logic function that selects one of the complementary pairs of bit lines responsive to an address provided to the column decoder. The row decoder comprises an array of vertical transistors that are selectively coupled to implement a logic function that selects a wordline based on a supplied address.

In another embodiment, a method of forming a logic array for a decoder is provided. The method includes forming an array of pillars of semiconductor material. Each pillar includes a first source/drain region, a body region and a second source/drain region that are vertically stacked and that extend outwardly from a substrate. A number of address lines are formed in trenches that separate rows of pillars. Selected pillars are gated with the address lines. Output lines are formed orthogonal to the address lines. The output lines each interconnect the second source/drain regions of pillars in a column of the array so as to implement a selected logic function.

BRIEF DESCRIPTION OF THE DRAWINGS

FIGS. 6, 7A, 7B, 8, 9, 10, 11, and 12 are elevational, perspective and top views of a portion of an embodiment of a decoder at various stages of an embodiment of a fabrication process according to the teachings of the present invention.

DETAILED DESCRIPTION

Figure 1:
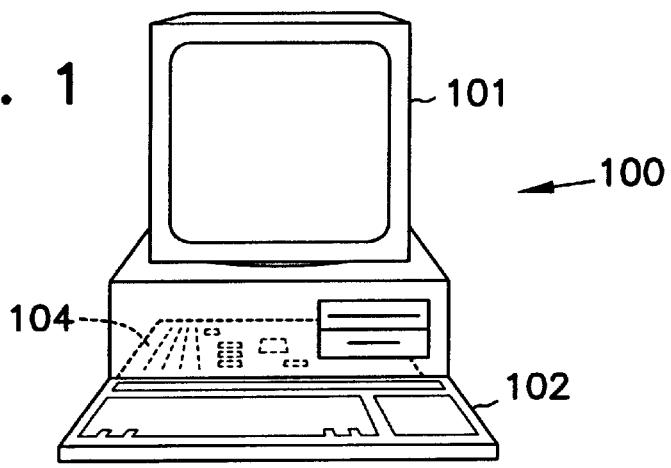
FIG. 1 is a block diagram of an embodiment of a computer according to the teachings of the present invention.

In the following detailed description, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high. However, an asterisk (*) following the signal name in this application indicates that the signal is negative or inverse logic. Negative or inverse logic is considered active when the signal is low.

The term "horizontal" as used in this application is defined as a plane parallel to the conventional plane or surface of a wafer or substrate, regardless of the orientation of the wafer or the substrate. The term "vertical" refers to a direction perpendicular to the horizontal as defined above. Prepositions, such as "on," "side," (as in sidewall), "higher," "lower," "over," and "under" are defined with respect to the conventional plane or surface being on the top surface of the wafer or substrate, regardless of the orientation of the wafer or substrate.

Figure 2:
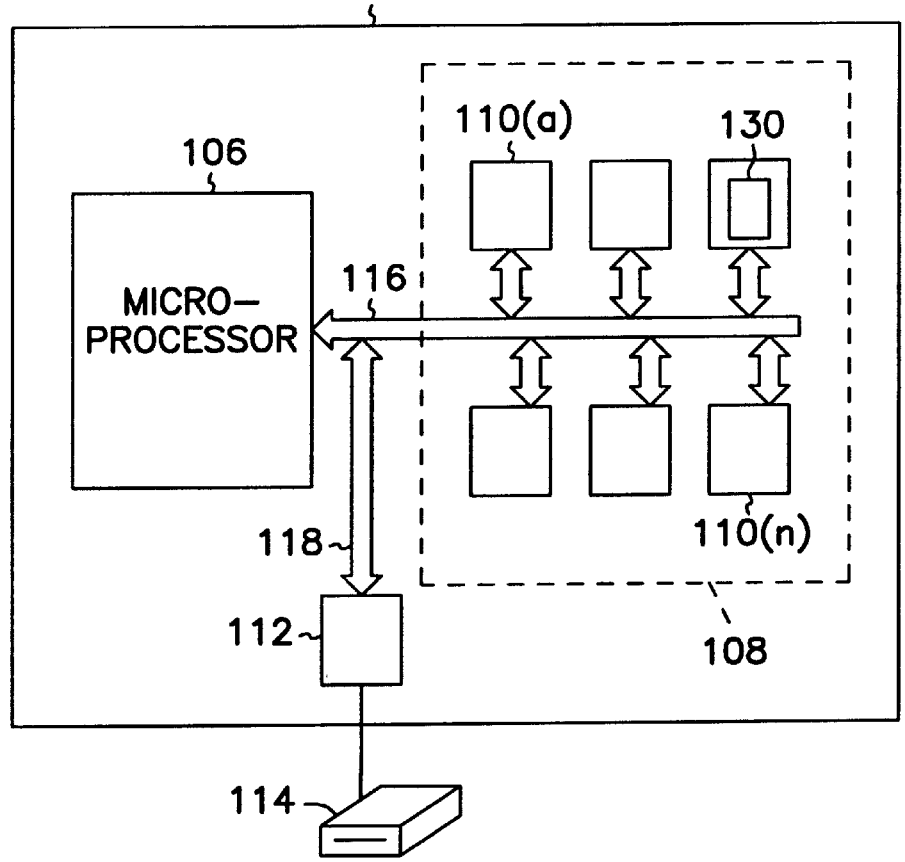
FIG. 2 is a block diagram of an embodiment of an interface for a microprocessor and a memory device for the computer of FIG. 1.

FIGS. 1 and 2 illustrate an embodiment of the present invention. Personal computer 100 includes a monitor 101, a keyboard input 102, and a central processing unit 104. The processing unit 104 typically includes a microprocessor 106, a memory bus circuit 108 having a plurality of memory slots 110($a$–$n$), and other peripheral circuitry 112. Peripheral circuitry 112 permits various peripheral devices 114 to interface the processor-memory bus 116 over the input/output (I/O) bus 118.

The microprocessor 106 produces control and address signals to control the exchange of data between the memory bus circuit 108 and the microprocessor 106, and between the memory bus circuit 108 and the peripheral circuitry 112. This exchange of data is accomplished over the high speed memory bus 116 and over the high speed I/O bus 118.

A plurality of memory slots 110($a$–$n$) are coupled to the memory bus 116 for receiving memory devices 130. Memory devices 130 include address decoder circuits that are formed with vertical transistors as described in more detail below. Memory devices 130 include, but are not limited to the following types: static random access memory (SRAM), dynamic random access memory (DRAM), synchronous dynamic random access memory (SDRAM), erasable programmable read-only memory (EPROM), electrically erasable programmable read-only memory (EEPROM), or Flash memories. A memory device 130 is illustrated in FIG. 2 in one of the memory slots 110($a$–$n$). A memory device 130 may be packaged as a single in-line memory module (SIMM) or a dual in-line memory module (DIMM), or any other packaging schemes well known in the art.

Figure 3:
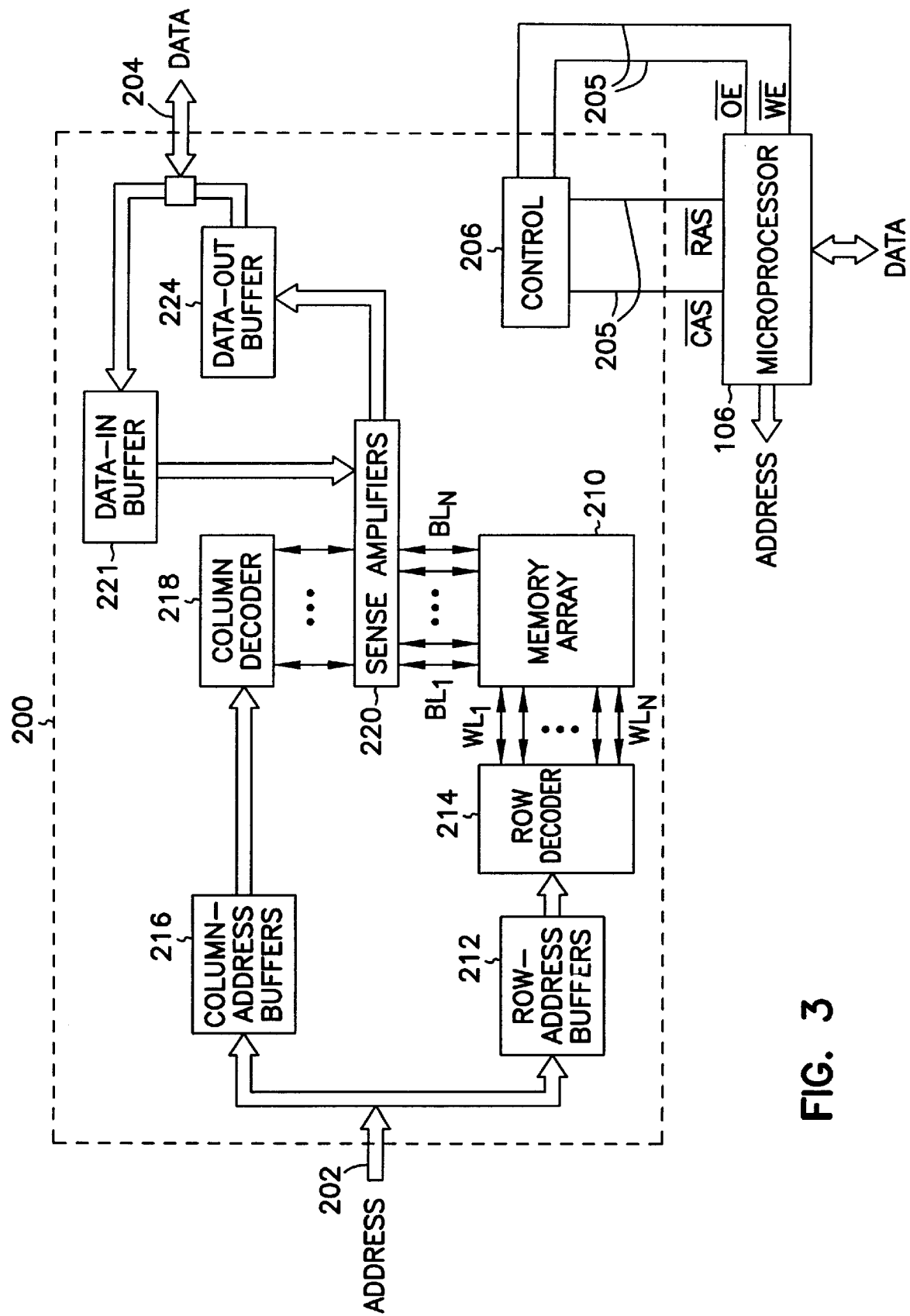
FIG. 3 is a block diagram illustrating generally an embodiment of an architecture of a memory circuit according to the teachings of the present invention.

FIG. 3 is a block diagram that illustrates another embodiment of the present invention. DRAM device 200 is compatible with the memory slots 110($a$–$n$). The description of the DRAM 200 has been simplified for purposes of illustrating a DRAM memory device and is not intended to be a complete description of all the features of a DRAM. Address information is provided on input line 202, data information is provided on input line 204, and control input is provided on a variety of input lines 205 directed to a control logic 206. Input lines 202, 204, and 205 correspond to individual inputs from the memory bus 116, for example, illustrated in FIG. 2.

The DRAM 200 includes a memory array 210 which in turn comprises rows and columns of addressable memory cells. Each memory cell in a row is coupled to a common wordline, as illustrated by lines $WL_1$–$WL_n$. Additionally, each memory cell in a column is coupled to a common bitline, as illustrated by lines $BL_1$–$BL_n$. Each cell in the memory array 210 includes a storage capacitor and a vertical access transistor.

The DRAM 200 interfaces with, for example, the microprocessor 106 through address lines 202 and data lines 204. Alternatively, DRAM 200 may interface with a DRAM controller, a micro-controller, a chip set or other electronic system. The microprocessor 106 also provides a number of control signals to the DRAM 200 via the control lines 205, including but not limited to, row and column address strobe signals RAS* and CAS*, write enable signal WE*, an output enable signal OE* and other conventional control signals.

A row address buffer 212 and a row decoder 214 receive and decode row addresses from row address signals provided on address lines 202 by, for example, the microprocessor 106. Each unique row address corresponds to a row of cells in the memory array 210. The row decoder 214 includes a wordline driver, an address decoder tree, and circuitry which translates a given row address received from the row address buffers 212 and selectively activates the appropriate wordline of the memory array 210 via the wordline drivers.

A column address buffer 216 and a column decoder 218 receive and decode column address signals provided on the address lines 202 by the microprocessor 106. Each unique column address corresponds to a column of cells in the memory array 210. The column decoder 218 also determines when a column is defective and the address of the replacement column. The column decoder 218 is coupled to sense amplifiers 220. The sense amplifiers 220 are coupled to complementary pairs of bitlines of the memory array 210.

The sense amplifiers 220 are coupled to a data-in buffer 221 and a data-out buffer 224. The data-in buffers 221 and the data-out buffers 224 are coupled to the data lines 204. During a write operation, the data lines 204 provide data to the data-in buffer 221. The sense amplifier 220 receives data from the data-in buffer 221 and stores the data in the memory array 210 as a charge on a capacitor of a cell at an address specified on the address lines 202.

During a read operation, the DRAM 200 transfers data to microprocessor 106 from the memory array 210. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of the sense amplifiers 220 detects and amplifies a difference in voltage between the complementary bitlines. The sense amplifier passes the amplified voltage to the data-out buffer 224.

The control logic 206 is used to control the many available functions of the DRAM 200. In addition, various control circuits and signals not detailed herein initiate and synchronize the DRAM 200 operation as known to those skilled in the art. As stated above, the description of DRAM 200 has been simplified for purposes of illustrating the present invention and is not intended to be a complete description of all the features of a DRAM.

Bitlines $BL_1$–$BL_n$ are used to write to and read data from the memory cells within the memory array 210. The wordlines $WL_1$–$WL_n$ are used to access a particular row of the memory cells that is to be written or read. The row decoder 214 and the column decoder 218 selectably access the memory cells in response to address signals that are provided on the address lines 202 from the microprocessor 106 during write and read operations.

In operation, the DRAM memory 200 receives an address of a particular memory cell at the address buffers 212 and 216. For example, the microprocessor 106 may provide the address buffers 212 and 216 with the address for a particular cell within the memory array 210. The row address buffer 212 identifies wordline $WL_1$, for example, for the appropriate memory cell to the row decoder 214. The row decoder 214 selectively activates the wordline $WL_l$ to activate a vertical access transistor of each memory cell connected to the wordline $WL_1$. The column address buffer 216 identifies bitline $BL_1$, for example, for the appropriate memory cell to the column decoder 218. The column decoder 218 selectively activates the bitline $BL_1$ to activate a vertical access transistor of each memory cell connected to the bitline $BL_1$.

Figure 4:
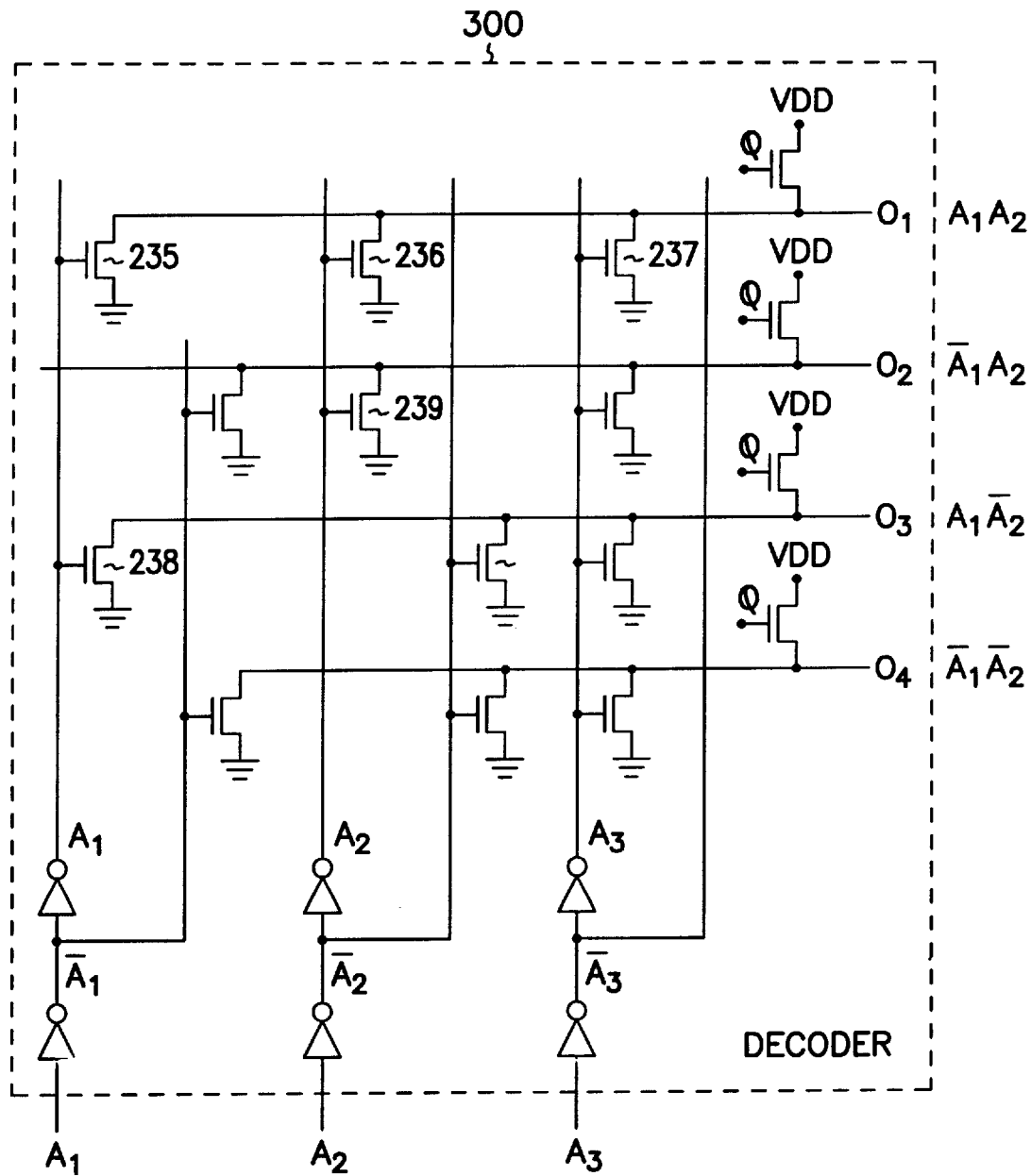
FIG. 4 is a schematic diagram illustrating generally an architecture of one embodiment of a programmable decoder according to the teachings of the present invention.

FIG. 4 is a schematic diagram that illustrates one embodiment of a decoder, indicated generally at 300, that is constructed according to the teachings of the present invention. Decoder 300 can be used, for example, as a memory address decoder such as column decoder 218 or row decoder 214 of FIG. 3.

Decoder 300 of FIG. 4 includes a number of vertical transistors that are formed at the intersection of output lines $O_1$ through $O_4$ with either an address line $A_1$ through $A_3$ or inverse address line $\overline{A}_1$ through $\overline{A}_3$. The inverse address lines are coupled to associated address lines through an inverter as shown. For example, transistor 235 is located at the intersection of address line $A_1$ and output line $O_1$.

Decoder 300 is programmed using a mask programming technique. That is, vertical transistors are formed at each intersection of an output line with either an address line or an inverse address line. However, not all of the vertical transistors are operatively coupled to the address lines, inverse address lines or the output lines. Rather, vertical transistors are selectively connected into the array in order to implement a desired logical function. Thus, once the array is fabricated, the logical function cannot be changed.

In this embodiment, each of the output lines implements a NOR logic function for the address lines and inverse address lines that are connected to it through the vertical transistors. For example, output line $O_1$ is coupled to the drains of transistors 235, 236, and 237. Transistors 235, 236, and 237 have gates that are coupled to receive signals from address lines $A_1$, $A_2$, and $A_3$, respectively. Output line $O_1$ produces the logical NOR of the logic values provided on address lines $A_1$, $A_2$, and $A_3$. Output line $O_1$ produces a low logic level when any one of the address lines $A_1$, $A_2$, and $A_3$ is brought to a high logic level. Further, output line $O_1$ produces a high logic level only when the address lines $A_1$, $A_2$, and $A_3$ are all at a low logic level at the same time.

The remaining output lines are selectively coupled to other transistors as shown to implement additional NOR functions. These NOR functions are chosen such that the input address lines (and inverse address lines) can be used to selectively address the output lines. It is noted that the logical functions implemented in array 300 are shown by way of illustration and not by way of limitation. Other logical functions can be implemented without departing from the spirit and scope of the present invention.

Generally speaking, decoder 300 can be fabricated with N address input lines to uniquely select $2^N$ output lines. In this case, two address lines, $A_1$ and $A_2$, are used to selectively access four output lines. The purpose of address line $A_3$ is to hold the output lines at a low level when an address signal has not yet been received.

Figure 5A:
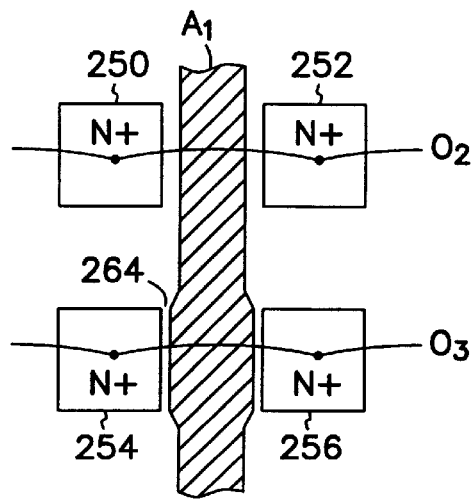
FIGS. 5A and 5B illustrate top and front views, respectively, of a portion of an embodiment of a decoder according to the teachings of the present invention.
Figure 5C:
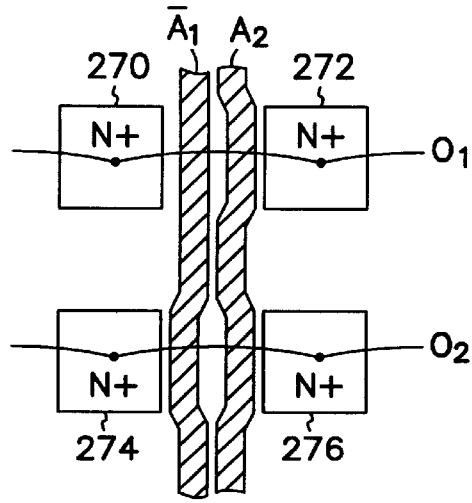
FIGS. 5C and 5D illustrate top and front views, respectively, of an alternative embodiment of a decoder array according to the teachings of the present invention.
Figure 5B:
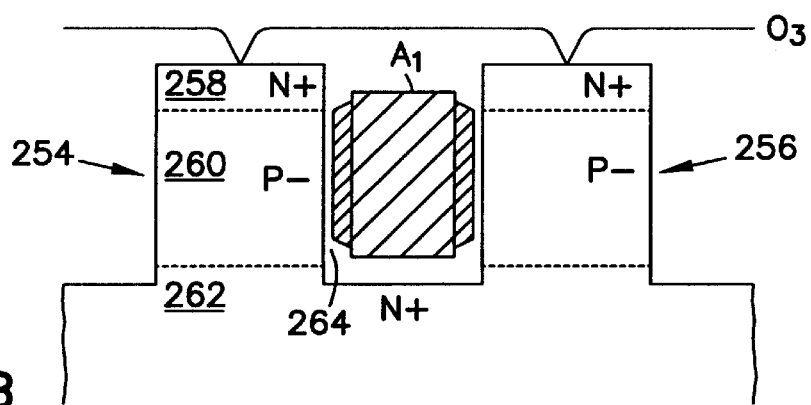

FIGS. 5A and 5B are top and front views of a portion of an embodiment of decoder 300 of FIG. 4. In this embodiment, each of the address lines, $A_1$, $A_2$, and $A_3$ and inverse address lines $\overline{A}_1$, $\overline{A}_2$ and $\overline{A}_3$ is formed in a trench that separates rows of monocrystalline semiconductor pillars. For example, FIGS. 5A and 5B illustrate that address line $A_1$ is housed in a trench that separates pillars 250 and 254, from pillars 252 and 256. Pillars 250, 252, 254, and 256 are each constructed in a similar manner. For simplicity, the construction of pillar 254 only is described here in detail. However, it is understood that the remaining pillars of decoder 300 are constructed in a similar manner.

Pillar 254 includes body region 260 that separates first and second source/drain regions 258 and 262. Address line $A_1$ passes between pillars 254 and 256. Address line $A_1$ is separated from body region 260 of pillar 254 by gate insulator 264. Source/drain region 258 of pillars 254 and 256 are coupled to output line $O_3$. In this manner, pillars 254 and 256 combine to provide the function of transistor 238 of FIG. 4. When a high logic level is applied to address line $A_1$, inversion layers are formed within the body regions of pillars 254 and 256 such that the pillars operate as metal-oxide-semiconductor field-effect transistors (MOSFET). By turning on these transistors, the output line is brought to ground potential. Otherwise, when address line $A_1$ is grounded, the transistors are off and the output line is allowed to maintain a high logic level, unaffected by the transistors.

As mentioned above, not all of the pillars of decoder 300 are coupled to the address lines or inverse address lines. Some of the pillars are selectively left unused so as to implement a desired logical function. For example, pillars 250 and 252 are located at the intersection of address line $A_1$ and output line $O_2$. As shown in FIG. 3, no transistor is required at this intersection in this embodiment. Thus, address line $A_1$ passes between pillars 250 and 252 with sufficient spacing from the pillars such that an inversion layer does not form in either pillar when a high voltage is applied to address line $A_1$. That is, the insulator that separates pillars 250 and 252 from address line $A_1$ creates a transistor with a threshold voltage that is sufficiently high so as to exceed the most positive gate voltage to be applied in decoder 300 such that the transistor will never turn on.

In this embodiment, two pillars are used for each transistor in decoder 300. Advantageously, this provides for redundancy in the performance of the logical function. If one of the pillars is defective or does not operate properly, the other pillar can continue to perform the logical operation. The cost of this redundancy is a decrease in circuit density because of the use of two pillars to perform the function of a single transistor.

Figure 5D:
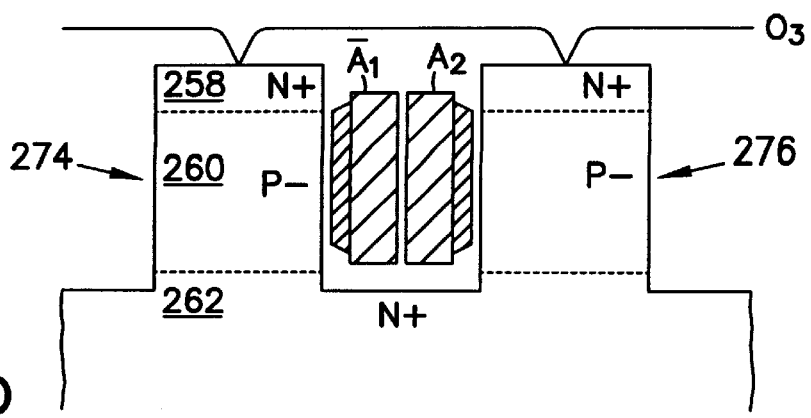

FIGS. 5C and 5D are top and front views of a portion of another embodiment of decoder 300 of FIG. 4. In this embodiment, one address line and one inverse address line are formed in a trench between adjacent rows of pillars. For example, address line $A_2$ and inverse address line $\overline{A}_1$ are formed in a trench that separates pillars 270 and 274 from pillars 272 and 276. Inverse address line $\overline{A}_1$ includes a gate portion that passes adjacent to a body region of pillar 274. Similarly, address line $A_2$ includes gate portions that pass adjacent to pillars 272 and 276. It is noted that inverse address line $\overline{A}_1$ is separated from pillar 270 such that pillar 270 does not function as a transistor at the intersection of output line $O_1$ and inverse address line $\overline{A}_1$. This embodiment is referred to as the split address line embodiment because two lines are placed between rows of pillars.

The advantage of the split address line embodiment is that the function of each transistor in decoder 300 is implemented in a single pillar. This produces a significant increase in the density of decoder 300.

FIGS. 6, 7A, 7B, 8, 9, 10, 11 and 12 illustrate generally one embodiment of a method of forming a decoder according to the teachings of the present invention. In this embodiment, a portion of the decoder, indicated generally at 400 is formed using bulk silicon processing techniques and is described, by way of example, with respect to a particular technology having a minimum lithographic feature size, F, which is also sometimes referred to as a critical dimension (CD), of 0.4 microns. However, the process steps described below can be scaled accordingly for other minimum feature sizes without departing from the scope of the invention. In the following description, doped semiconductor layers are, on occasion, identified by the type and concentration of dopant used in the layer. For example, some layers are referred to as "N+" semiconductor layers. The N means that the layer is N-type and the "+" means that the layer is heavily doped. Similarly, "P" is used to reference P-type semiconductor material and "−" is used to indicated a light dopant concentration.

In FIG. 6, a P+ silicon starting material is used for substrate 305. A first source/drain layer 500, of approximate thickness of 0.2 microns, is formed at a working surface of substrate 305. In one embodiment, first source/drain layer 500 is N+ silicon formed by ion-implantation of donor dopants into substrate 305. In another embodiment, first source/drain layer 500 is N+ silicon formed by epitaxial growth of silicon upon substrate 305. On the first source/drain layer 500, a semiconductor epitaxial layer 505, such as P− silicon of 0.4 micron approximate thickness, is formed, such as by epitaxial growth. Layer 505 is referred to as body layer 505.

A second source/drain layer 510, such as N+ silicon of 0.1 to 0.2 microns approximate thickness, is formed at a surface of the epitaxial layer 505, such as by ion-implantation of donor dopants into P− epitaxial layer 505 or by epitaxial growth of N+ silicon on P− epitaxial layer 505. A thin layer of silicon dioxide ($SiO_2$), referred to as pad oxide 515, is deposited on the second source/drain layer 510. Pad oxide 515 has a thickness of approximately 10 nanometers. A layer of silicon nitride ($Si_3N_4$), referred to as pad nitride 520, is deposited on the pad oxide 515. Pad nitride 520 has a thickness of approximately 100 nanometers.

Figure 7A:
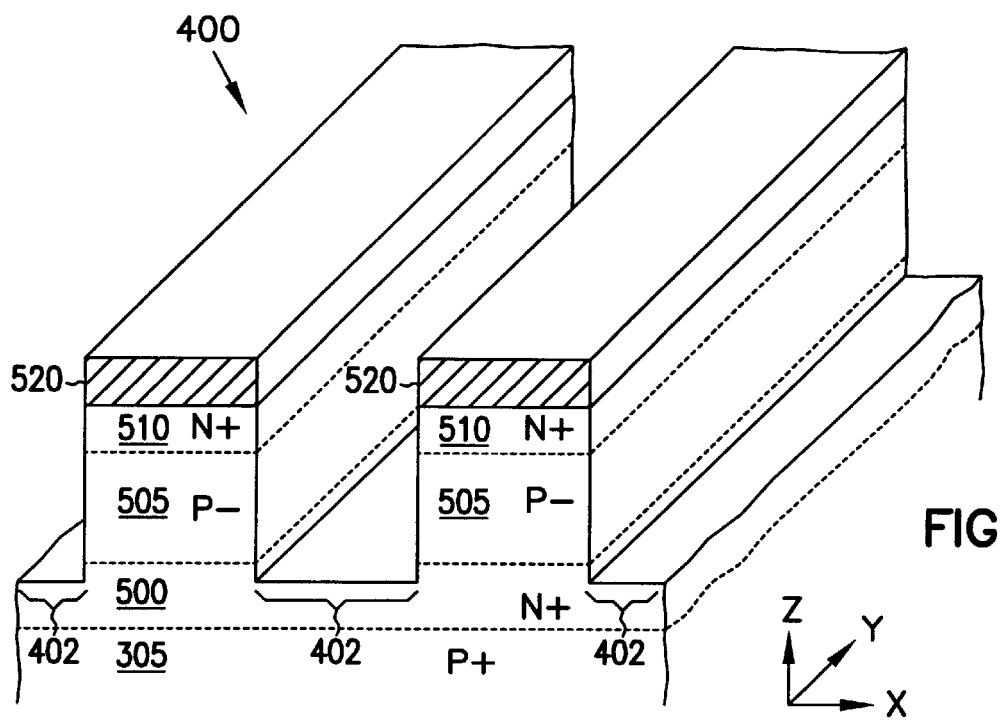
Figure 7B:
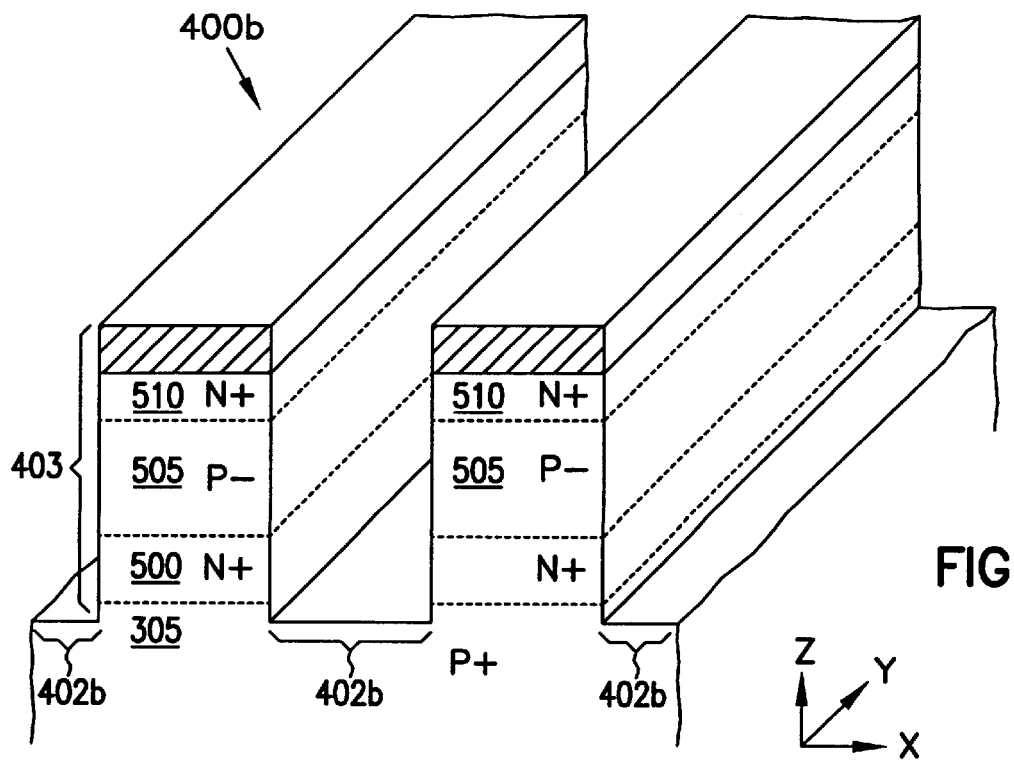

A photoresist layer is deposited outwardly from pad nitride 520. The photoresist layer is exposed through a mask to define parallel minimum dimension stripes in the Y-direction. In the embodiment of FIG. 7A, trenches 402 are formed through the stripe pattern in the photoresist layer. Trenches 402 extend through pad nitride 520, second source/drain layer 510, body layer 505 and into first source/drain layer 500. In this case, first source/drain layer 500 is maintained at ground potential to act as a ground plane for decoder 400. In the embodiment of FIG. 7B, trenches 402b extend through pad nitride 520, second source/drain layer 510, body layer 505, first source/drain layer 500 and into substrate 305. In this embodiment, the ground plane is divided into a number of separate ground lines for the decoder.

The remaining steps are described in terms of the embodiment of FIG. 7A although similar steps can be applied to complete the embodiment of FIG. 7B. The photoresist is removed by conventional photoresist stripping techniques.

Figure 8:
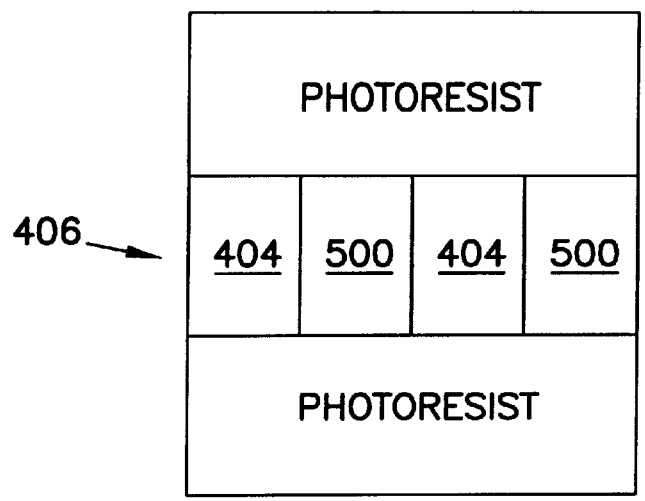

Next, a second set of trenches are formed so as to create an array of semiconductor pillars. Existing trenches 402 are filled with an insulator by, for example, chemical vapor deposition of oxide layer 404. Oxide layer 404 is planarized with nitride pad 520 such as by chemical mechanical polishing (CMP) or other suitable planarization technique. Another photoresist layer is deposited and masked to define a second set of minimum dimension stripes that are orthogonal to trenches 402, i.e., in the X-direction. A nitride etchant is used to etch through pad 520. Next, a selective silicon etchant is used to etch exposed silicon to a depth approximately equal to trenches 402. A top view of this portion of decoder 400 is shown in FIG. 8.

Figure 9:
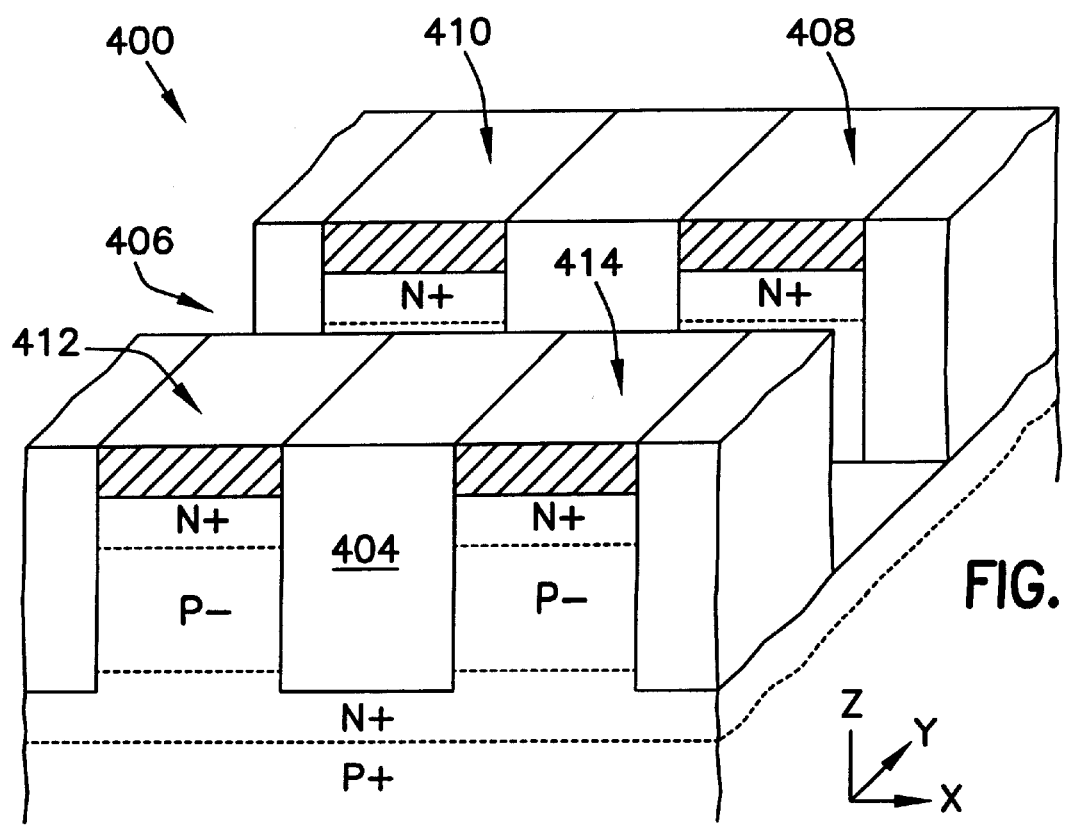

With the photoresist layer still in place, exposed portions of oxide layer 404 are removed stopping on the silicon material at the bottom of trenches 402. The photoresist layer is then removed by conventional photoresist stripping techniques. This leaves the structure as shown in FIG. 9 with trenches 406 separating rows of semiconductor pillars. FIG. 9 explicitly shows pillars 408, 410, 412 and 414. However, it is understood that decoder 400 includes a large number of pillars that are formed in a number of rows and columns defined by trenches 402 and 406.

Next, address lines and gates are selectively formed in trenches 406. The gates are formed adjacent to selected pillars such that decoder 400 implements a desired function.

Nitride ($Si_3N_4$) is deposited by, for example, chemical vapor deposition with a thickness on the order of 10 nanometers. The nitride layer is directionally etched to leave on vertical walls only of trench 406. Thermal oxide layer 416 is grown on the bottom of trenches 406 to a thickness of approximately 100 nanometers and the nitride layer is stripped from the vertical sidewalls.

Figure 10:
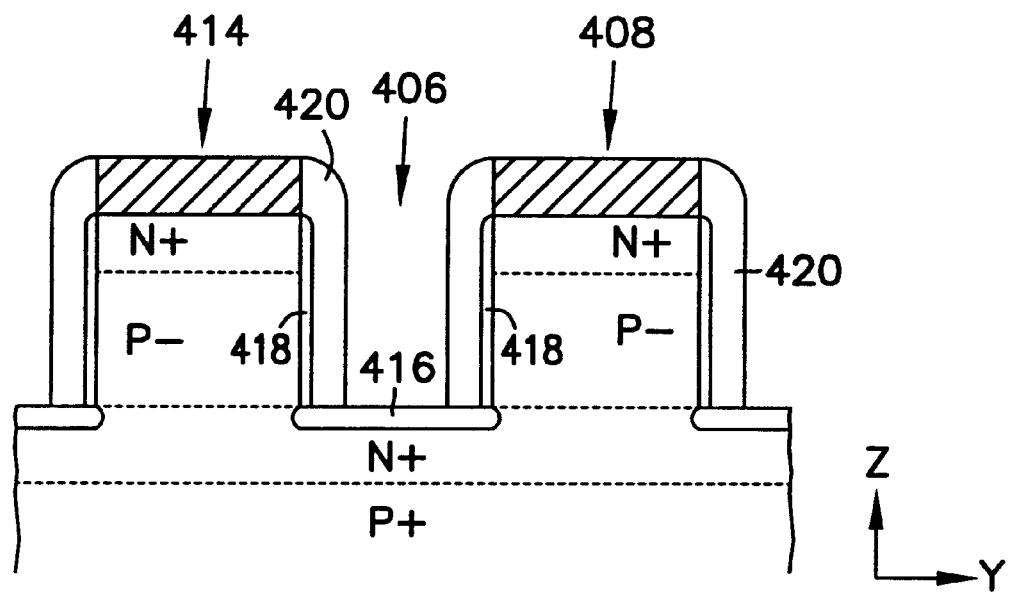
Figure 11:
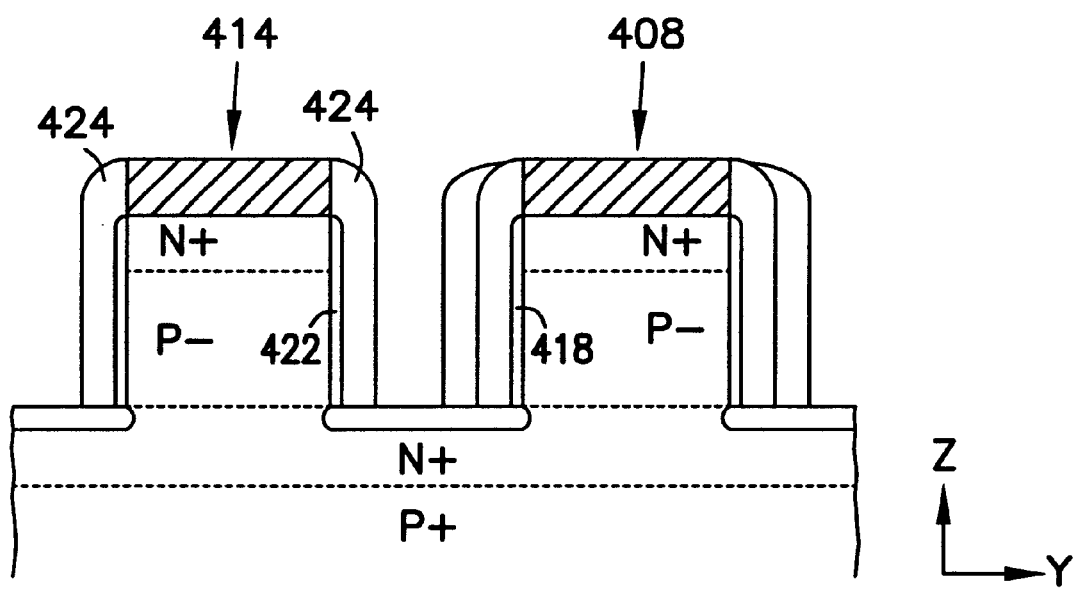
Figure 12:
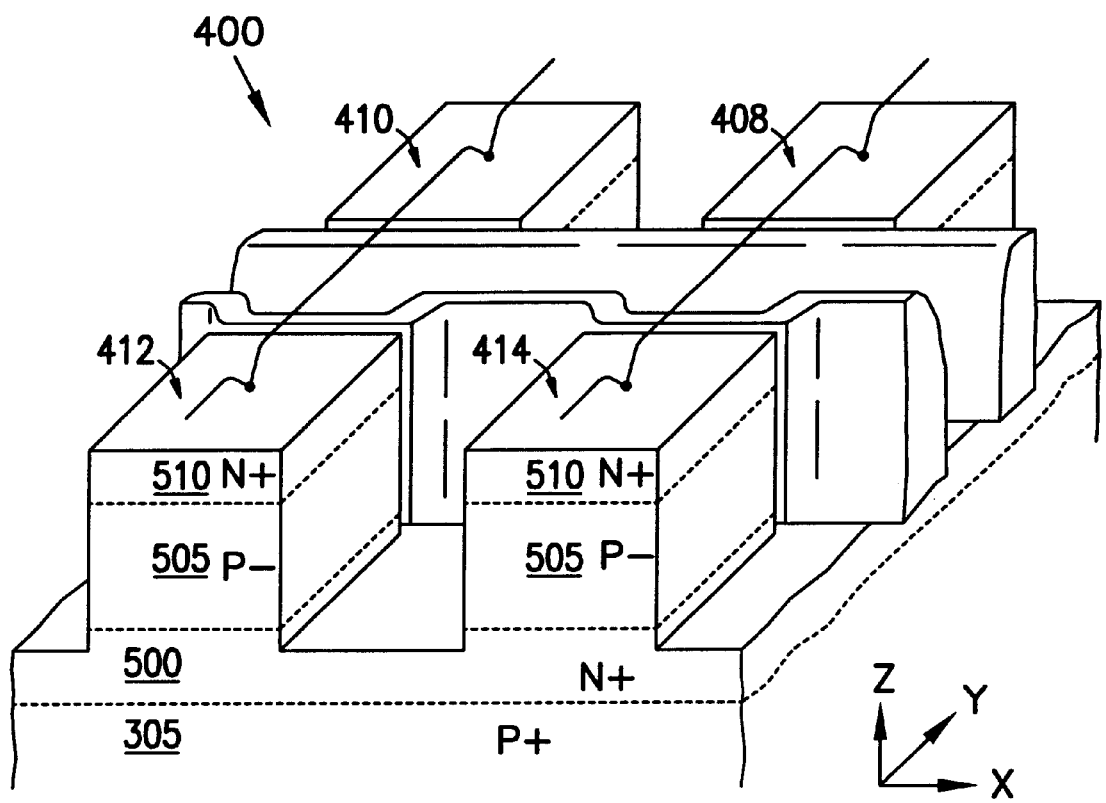

Protective oxide layer 418 is formed, for example, by growing a thin thermal oxide layer of approximately 10 nanometers on the side walls of trenches 406. Intrinsic polysilicon layer 420 is deposited by, for example, chemical vapor deposition with a thickness of approximately 50 nanometers. Layer 420 is etched by, for example, reactive ion etching (RIE) techniques to leave layer 420 on vertical sidewalls only. This structure is shown in FIG. 10.

Next, decoder 400 is mask programmed by selectively removing portions of polysilicon layer 420 adjacent to pillars where a transistor is needed to implement a desired logic function. A gate is then formed adjacent to these pillars. As for the remaining pillars, polysilicon layer 420 acts as a spacer that prevents an address line or inverse address line from being formed sufficiently close to the pillar so as to form a gate of a transistor.

A photoresist layer is applied and selectively exposed through a mask to uncover the sidewalls, and adjacent layer 420, of selected pillars to implement the desired logical function. The exposed portions of layer 420 are etched from the vertical sidewalls in trenches 406. The resist is removed and gate insulator 422, e.g., silicon dioxide is grown or deposited on the vertical sidewalls at the locations where portions of layer 420 were removed, e.g., on the vertical sidewall of pillar 414. N+ polysilicon is deposited by chemical vapor deposition with a thickness of approximately 50 nanometers. The polysilicon layer is directionally etched to leave layer 424 on vertical surfaces only and to expose the tops of layer 420. All exposed nitride layers are removed. Techniques known in the art are used to remove the remaining portions of layer 420 selectively to doped silicon. Oxide is deposited by chemical vapor deposition to fill the recesses in decoder 400 and to cover the semiconductor pillars. Output lines and contacts are formed using conventional processing techniques to connect columns of pillars.

In the described embodiment, split address lines are shown. It is understood that once the gate oxide is in place, the trench can be filled with N+ polysilicon to create a single address line between the rows of pillars in a non-split address line embodiment of the type shown in FIGS. 5A and 5B.

Conclusion

Embodiments of the present invention provide a decoder with an increased density with respect to conventional decoder arrays. Specifically, vertical transistors are used at the intersection of output lines and address or inverse address lines. The vertical transistors are selectively coupled by mask programming to these lines so as to implement a desired logical function that allows the output lines to be selectively addressed. It is to be understood that the above description is intended to be illustrative, and not restrictive. Many other embodiments will be apparent to those of skill in the art upon reviewing the above description. For example, the logical function implemented by the decoder can be varied without departing from the scope of the present invention. Further, the number of address and inverse address lines can be similarly varied for a specific application. Thus, the scope of the invention is not limited to the particular embodiments shown and described herein. Further, in the split gate embodiment, every other address line could be used as a body bias signal rather than an address signal.

What is claimed is:

1. A decoder for a memory device, comprising:
   a number of address lines;
   a number of output lines;
   wherein the address lines, and the output lines form an array; and
   a number of vertical transistors that are selectively disposed at intersections of output lines and address lines, wherein each transistor is formed in at least one pillar of semiconductor material that extends outwardly from a working surface of a substrate to form source, drain, and body regions for the transistor, a gate is also formed along at least one side of the at least one pillar and is coupled to one of the number of address lines such that the transistors in the array implement a logic function that selects an output line responsive to an address provided to the address lines.

2. The decoder of claim 1, wherein the number of address lines includes a number of complementary address lines that are disposed in the array with vertical transistors selectively formed in pillars at intersections of the complementary address lines with the output lines.

3. The decoder of claim 1, wherein address lines are disposed in trenches that separate adjacent rows of pillars.

4. The decoder of claim 3, wherein the vertical transistors are each formed in one pillar with one of the address lines forming a gate adjacent to a sidewall of the body region of the pillar, and an output line coupled to a drain region of the pillar.

5. The decoder of claim 4, wherein two address lines are formed in each trench.

6. The decoder of claim 3, wherein the vertical transistors are each formed in a pair of adjacent pillars with an address line passing between the pillars and forming gates adjacent to a sidewall of the body region of each pillar in the pair, and an output line coupled to a drain region of each pillar.

7. The decoder of claim 1, wherein the substrate is a bulk semiconductor.

8. The decoder of claim 1, wherein the working surface of the substrate includes an insulating layer formed on top of an underlying semiconductor.

9. The decoder of claim 1, wherein the decoder is operatively coupled to a dynamic random access memory (DRAM) device.

10. The decoder of claim 1, wherein the array includes N address lines and $2^N$ output lines.

11. The decoder of claim 1, wherein the number of address lines includes a number of complementary address lines that are each coupled to one of the address lines through an inverter and are disposed in the array with vertical transistors selectively formed in pillars at intersections of the complementary address lines with the output lines.

12. A memory device, comprising:
   an array of word lines and complementary bit line pairs;
   a number of memory cells that are each addressably coupled at intersections of a word line with a bit line of a complementary bit line pair;
   a row decoder that is coupled to the word lines so as to implement a logic function that selects one of the word lines responsive to an address provided to the row decoder;

a number of sense amplifiers, each coupled to a complementary pair of bit lines;

a column decoder that is coupled to the sense amplifiers so as to implement a logic function that selects one of the complementary pairs of bit lines responsive to an address provided to the column decoder; and wherein the row decoder comprises an array of vertical transistors that are formed in pillars of semiconductor material and that are selectively coupled to implement a logic function that selects a wordline based on a supplied address.

13. The memory device of claim 12, wherein the row decoder includes: a number of address lines;

a number of output lines that are selectively coupled to the wordlines;

wherein the address lines, and the output lines form an array; and a number of vertical transistors that are selectively disposed at intersections of output lines and address lines, wherein each transistor is formed in at least one pillar of semiconductor material that extends outwardly from a working surface of a substrate to form source, drain, and body regions for the transistor, a gate is also formed along at least one side of the at least one pillar and is coupled to one of the number of address lines such that the transistors in the array implement a logic function that selects an output line responsive to an address provided to the address lines.

14. The memory device of claim 13, wherein the number of address lines includes a number of complementary address lines that are disposed in the array with vertical transistors selectively formed in pillars at intersections of the complementary address lines with the output lines.

15. The memory device of claim 13, wherein address lines are disposed in trenches that separate adjacent rows of pillars.

16. The memory device of claim 15, wherein the vertical transistors are each formed in one pillar with one of the address lines forming a gate adjacent to a sidewall of the body region of the pillar, and an output line coupled to a drain region of the pillar.

17. The memory device of claim 16, wherein two address lines are formed in each trench.

18. The memory device of claim 15, wherein the vertical transistors are each formed in a pair of adjacent pillars with an address line passing between the pillars and forming gates adjacent to a sidewall of the body region of each pillar in the pair, and an output line coupled to a drain region of each pillar.

19. The memory device of claim 13, wherein the substrate is a bulk semiconductor.

20. The memory device of claim 13, wherein the working surface of the substrate includes an insulating layer formed on top of an underlying semiconductor.

21. The memory device of claim 13, wherein the array includes N address lines and $2^N$ output lines.

22. The memory device of claim 13, wherein the number of address lines includes a number of complementary address lines that are each coupled to one of the address lines through an inverter and are disposed in the array with vertical transistors selectively formed in pillars at intersections of the complementary address lines with the output lines.

23. A computer system, comprising:

a microprocessor;

a memory device coupled to the microprocessor; and wherein the memory device comprises:

an array of word lines and complementary bit line pairs;

a number of memory cells that are each addressably coupled at intersections of a word line with a bit line of a complementary bit line pair;

a row decoder that is coupled to the word lines so as to implement a logic function that selects an one of the word lines responsive to an address provided to the row decoder;

a number of sense amplifiers, each coupled to a complementary pair of bit lines;

a column decoder that is coupled to the sense amplifiers so as to implement a logic function that selects one of the complementary pairs of bit lines responsive to an address provided to the column decoder; and wherein the row decoder comprises an array of vertical transistors that are formed in pillars of semiconductor material and that are coupled to implement a logic function that selects a wordline or complementary bit line pair based on a supplied address.

24. The system of claim 23, wherein the row decoder includes:

a number of address lines;

a number of output lines that are selectively coupled to the wordlines;

wherein the address lines, and the output lines form an array; and a number of vertical transistors that are selectively disposed at intersections of output lines and address lines, wherein each transistor is formed in at least one pillar of semiconductor material that extends outwardly from a working surface of a substrate to form source, drain, and body regions for the transistor, a gate is also formed along at least one side of the at least one pillar and is coupled to one of the number of address lines such that the transistors in the array implement a logic function that selects an output line responsive to an address provided to the address lines.

25. The system of claim 24, wherein the number of address lines includes a number of complementary address lines that are disposed in the array with vertical transistors selectively formed in pillars at intersections of the complementary address lines with the output lines.

26. The system of claim 24, wherein address lines are disposed in trenches that separate adjacent rows of pillars.

27. The system of claim 26, wherein the vertical transistors are each formed in one pillar with one of the address lines forming a gate adjacent to a sidewall of the body region of the pillar, and an output line coupled to a drain region of the pillar.

28. The system of claim 27, wherein two address lines are formed in each trench.

29. The system of claim 26, wherein the vertical transistors are each formed in a pair of adjacent pillars with an address line passing between the pillars and forming gates adjacent to a sidewall of the body region of each pillar in the pair, and an output line coupled to a drain region of each pillar.

30. The system of claim 26, wherein the substrate is a bulk semiconductor.

31. The system of claim 26, wherein the working surface of the substrate includes an insulating layer formed on top of an underlying semiconductor.

32. The system of claim 26, wherein the array includes N address lines and $2^N$ output lines.

33. The system of claim 26, wherein the number of address lines includes a number of complementary address lines that are each coupled to one of the address lines through an inverter and are disposed in the array with vertical transistors selectively formed in pillars at intersections of the complementary address lines with the output lines.

* * * * *